United States Patent
Shi et al.

(10) Patent No.: US 11,374,688 B2
(45) Date of Patent: Jun. 28, 2022

(54) DATA TRANSMISSION METHOD AND DEVICE FOR INTELLIGENT DRIVING VEHICLE, AND DEVICE

(71) Applicant: BAIDU ONLINE NETWORK TECHNOLOGY (BEIJING) CO., LTD., Beijing (CN)

(72) Inventors: Yifeng Shi, Beijing (CN); Xing Hu, Beijing (CN); Haisong Wang, Beijing (CN); Lei Fang, Beijing (CN); Ji Tao, Beijing (CN)

(73) Assignee: Apollo Intelligent Driving Technology (Beijing) Co., Ltd., Beijing (CN)

( * ) Notice: Subject to any disclaimer, the term of this patent is extended or adjusted under 35 U.S.C. 154(b) by 181 days.

(21) Appl. No.: 16/555,972

(22) Filed: Aug. 29, 2019

(65) Prior Publication Data
US 2020/0076530 A1    Mar. 5, 2020

(30) Foreign Application Priority Data

Aug. 31, 2018    (CN) .......................... 201811011553.1

(51) Int. Cl.
*H04L 1/00*       (2006.01)
*G06K 9/00*       (2022.01)
(Continued)

(52) U.S. Cl.
CPC ........... *H04L 1/008* (2013.01); *G05D 1/0223* (2013.01); *G05D 1/0238* (2013.01);
(Continued)

(58) Field of Classification Search
CPC ..... H04L 1/008; H04L 1/0007; G05D 1/0223; G05D 1/0238; G05D 1/0257; G06K 9/00825
See application file for complete search history.

(56) References Cited

U.S. PATENT DOCUMENTS

| 8,179,281 B2 | 5/2012 | Strauss |
| 2004/0193347 A1* | 9/2004 | Harumoto .............. G08G 1/167 701/45 |

(Continued)

FOREIGN PATENT DOCUMENTS

| CN | 107046529 A | 8/2017 |
| CN | 108182817 A | 6/2018 |

(Continued)

OTHER PUBLICATIONS

Description of English Translation of Foreign Reference: JPH0795262A.*

(Continued)

*Primary Examiner* — Rami Khatib
*Assistant Examiner* — Shahira Baajour
(74) *Attorney, Agent, or Firm* — Lathrop GPM LLP

(57) ABSTRACT

The present disclosure provides a data transmission method and a data transmission device for an intelligent driving vehicle, and a device. The method includes: acquiring data to be transmitted; encoding the data to be transmitted to generate encoded data; generating a check digit according to the data to be transmitted; adding the encoded data to a data packet, wherein a trailer of the data packet comprises the check digit; and transmitting the data packet.

11 Claims, 4 Drawing Sheets

(51) Int. Cl.
*G05D 1/02* (2020.01)
*G06V 20/58* (2022.01)

(52) U.S. Cl.
CPC ......... *G05D 1/0257* (2013.01); *G06V 20/584* (2022.01); *H04L 1/0007* (2013.01)

(56) References Cited

U.S. PATENT DOCUMENTS

| | | | |
|---|---|---|---|
| 2012/0283945 A1 | 11/2012 | Bird et al. | |
| 2013/0054695 A1* | 2/2013 | Holman | G09B 19/00 709/204 |
| 2013/0278440 A1 | 10/2013 | Rubin et al. | |
| 2015/0063280 A1* | 3/2015 | Nan | H04L 1/0058 370/329 |
| 2017/0186327 A1 | 6/2017 | Uysal et al. | |
| 2019/0026796 A1* | 1/2019 | Dinis da Silva de Carvalho | G06Q 50/30 |

FOREIGN PATENT DOCUMENTS

| | | |
|---|---|---|
| CN | 108243259 A | 7/2018 |
| EP | 0524676 A1 | 1/1993 |
| JP | H05134712 A | 6/1993 |
| JP | H0795262 A | 4/1995 |
| JP | 2007141127 A | 6/2007 |
| JP | 2009282713 A | 12/2009 |
| JP | 2010140186 A | 6/2010 |
| JP | 2010152656 A | 7/2010 |
| JP | 2010263339 A | 11/2010 |
| JP | 2013058845 A | 3/2013 |
| JP | 2013229891 A | 11/2013 |
| JP | 2015184243 A | 10/2015 |
| JP | 2017126219 A | 7/2017 |
| WO | WO 2016013040 A1 | 1/2016 |
| WO | WO-2019106318 A1 * | 6/2019 ........... G05D 1/0238 |

OTHER PUBLICATIONS

Description of English Translation of Foreign Reference: JP2013058845A.*
European Patent Application No. 19193025.4 partial Search and Opinion dated Jan. 20, 2020, 13 pages.
Japanese Patent Application No. 2019119768 Office Action dated Aug. 25, 2020, 4 pages.
Japanese Patent Application No. 2019119768 English translation of Office Action dated Aug. 25, 2020, 4 pages.
Chinese Patent Application No. 20181101553.1 Office Action dated Oct. 28, 2021, 9 pages.
Chinese Patent Application No. 20181101553.1 English translation of Office Action dated Oct. 28, 2021, 8 pages.

* cited by examiner

DATA TRANSMISSION METHOD AND DEVICE FOR INTELLIGENT DRIVING VEHICLE, AND DEVICE

CROSS-REFERENCE TO RELATED APPLICATIONS

This application claims priority to and benefits of Chinese Patent Application No. 201811011553.1, filed with the National Intellectual Property Administration of P. R. China on Aug. 31, 2018, the entire contents of which are incorporated herein by reference.

TECHNICAL FIELD

The present disclosure relates to the field of data transmission technology, and more particularly, to a data transmission method for an intelligent driving vehicle, a data transmission device for an intelligent driving vehicle, and a non-transitory computer readable storage medium.

BACKGROUND

In a typical autonomous driving system, wireless communication between one vehicle and another vehicle is required. Wireless communication between a vehicle and a server is also required in order to transmit information about the vehicle. As the number of communications increases, when data are transmitted simultaneously in a network containing a plurality of devices, interference may be a serious issue because the data are in the same frequency band, and packet loss, packet error and reordering may occur, resulting in communication failure between vehicles, or between the vehicle and the server. Therefore, a communication system with higher reliability and safety is required for the autonomous driving system.

SUMMARY

Embodiments of the present disclosure provide a data transmission method for an intelligent driving vehicle. In one embodiment, the method includes: acquiring data to be transmitted; encoding the data to be transmitted to generate encoded data; generating a check digit according to the data to be transmitted; adding the encoded data to a data packet, in which a trailer of the data packet includes the check digit; and transmitting the data packet.

Embodiments of the present disclosure provide an electronic device. In one embodiment, the electronic device includes a processor and a memory. The memory is configured to store executable program codes, and the processor is configured to run a program corresponding to the executable program codes by reading the executable program codes stored in the memory to perform the data transmission method for an intelligent driving vehicle according to embodiments of the present disclosure.

Embodiments of the present disclosure provide a non-transitory computer readable storage medium having a computer program stored thereon. When the computer program is executed by a processor, causes the data transmission method for an intelligent driving vehicle according to embodiments of the present disclosure to be implemented.

Additional aspects and advantages of embodiments of present disclosure will be given in part in the following descriptions, become apparent in part from the following descriptions, or be learned from the practice of the embodiments of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements Embodiments described herein with reference to drawings are explanatory, serve to explain the present disclosure, and are not construed to limit the scope of the present disclosure.

The data transmission method for an intelligent driving vehicle, the data transmission device for an intelligent driving vehicle, and device according to embodiments of the present disclosure will be described below with reference to the accompanying drawings.

Figure 1:
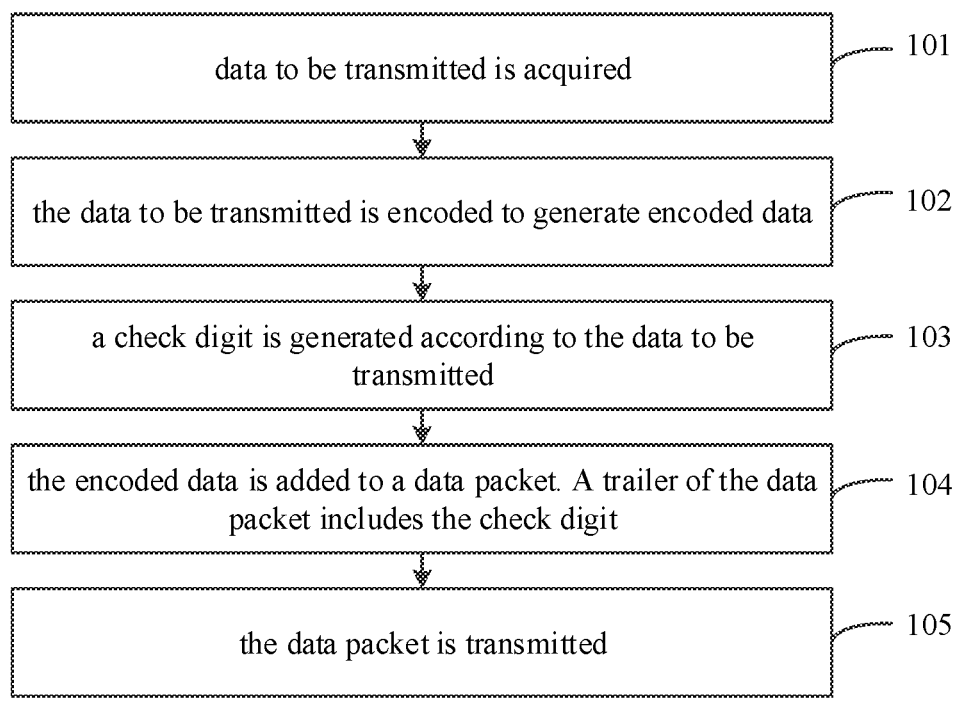
FIG. 1 is a flow chart of a data transmission method for an intelligent driving vehicle according to an embodiment of the present disclosure.

FIG. 1 is a flow chart of a data transmission method for an intelligent driving vehicle according to an embodiment of the present disclosure. As shown in FIG. 1, the method may include the following.

At block 101, data to be transmitted is acquired.

In an embodiment of the present disclosure, when the intelligent driving vehicle performs data transmission, the intelligent driving vehicle needs to acquire the data to be transmitted first. For example, obstacle information may be acquired by a radar of the intelligent driving vehicle, and the data to be transmitted can be generated according to the obstacle information. Moreover, traffic light information may be acquired by a camera of the intelligent driving vehicle, and the data to be transmitted can be generated according to the traffic light information.

At block 102, the data to be transmitted is encoded to generate encoded data.

In an embodiment of the present disclosure, a serialization operation may be performed on the data to be transmitted to generate the encoded data, and a data length of the encoded data can be acquired.

For example, the data to be transmitted may be serialized by Protocol Buffer (a tool for serializing data), to serialize the data to be transmitted into binary data, and the data length of the serialized binary data can be acquired. For example, the serialized encoded data is "1001", and the data length of the encoded data is 4 bit.

In an embodiment of the present disclosure, character encoding may be performed on the data to be transmitted to generate the encoded data, and the data length of the encoded data can be acquired.

It should be noted that, the above manners of encoding the data to be transmitted are merely exemplary, and those skilled in the art may select the encoding manner according to actual needs, which is not limited herein.

At block 103, a check digit is generated according to the data to be transmitted.

In an embodiment of the present disclosure, the encoded data to be transmitted may be calculated by a related algorithm to generate the check digit of the encoded data. For example, a parity bit may be generated based on the parity (even or odd) of the encoded data. For another example, a generator polynomial may be acquired based on the encoded data, and a cyclic redundancy check may be acquired based on to the generator polynomial.

The check digit may include, but is not limited to, a parity bit, a cyclic redundancy check, and the like.

In an embodiment of the present disclosure, the data to be transmitted may be calculated by a related algorithm to generate the check digit.

At block 104, the encoded data is added to a data packet. A trailer of the data packet includes the check digit.

Figure 2:
FIG. 2 is a schematic diagram of a data packet according to an embodiment of the present disclosure.

In an embodiment of the present disclosure, the encoded data may be added to the data packet, the data length of the encoded data may be added to the header of the data packet, and the check digit may be added to the trailer of the data packet. For example, as illustrated in FIG. 2, the header of the data packet may include an acknowledgment bit and the data length of the encoded data, the trailer of the data packet may include the check digit.

In the embodiment, by adding the data length of the encoded data to the header of the data packet, the data length of the encoded data may be extracted first when decoding, and the encoded data can be extracted from the data packet based on the data length of the encoded data. Further, the encoded data may be checked based on the check digit after it is extracted.

At block 105, the data packet is transmitted.

In an embodiment of the present disclosure, the intelligent driving vehicle may transmit the data packet to a server, such that the server can perform scheduling control on the intelligent driving vehicle based on the received data.

In an embodiment of the present disclosure, the intelligent driving vehicle may transmit the data packet to other intelligent driving vehicles, such that other intelligent driving vehicles can know information such as the driving state of the intelligent driving vehicle based on the received data.

For example, the data packet may be transmitted to the server or other intelligent driving vehicles via V2X (vehicle-to-everything, a communication technology for vehicle and everything).

For another example, the data packet may be transmitted to the server or other intelligent driving via WIFI (Wireless Fidelity).

As described above, with the data transmission method for an intelligent driving vehicle according to embodiments of the present disclosure, the data to be transmitted is acquired and encoded to generate encoded data. Moreover, the check digit is generated according to the data to be transmitted, the encoded data and the check digit are added to the data packet, and the data packet is transmitted. Thus, by encoding the data to be transmitted, the data to be transmitted can be compressed, the transmitted data stream can be reduced, the probability of occurrence of packet error, packet loss or reordering can be reduced, the reliability of data transmission can be improved, and by converting meaningful text into meaningless garbled text, the security of data transmission can be increased.

Figure 3:
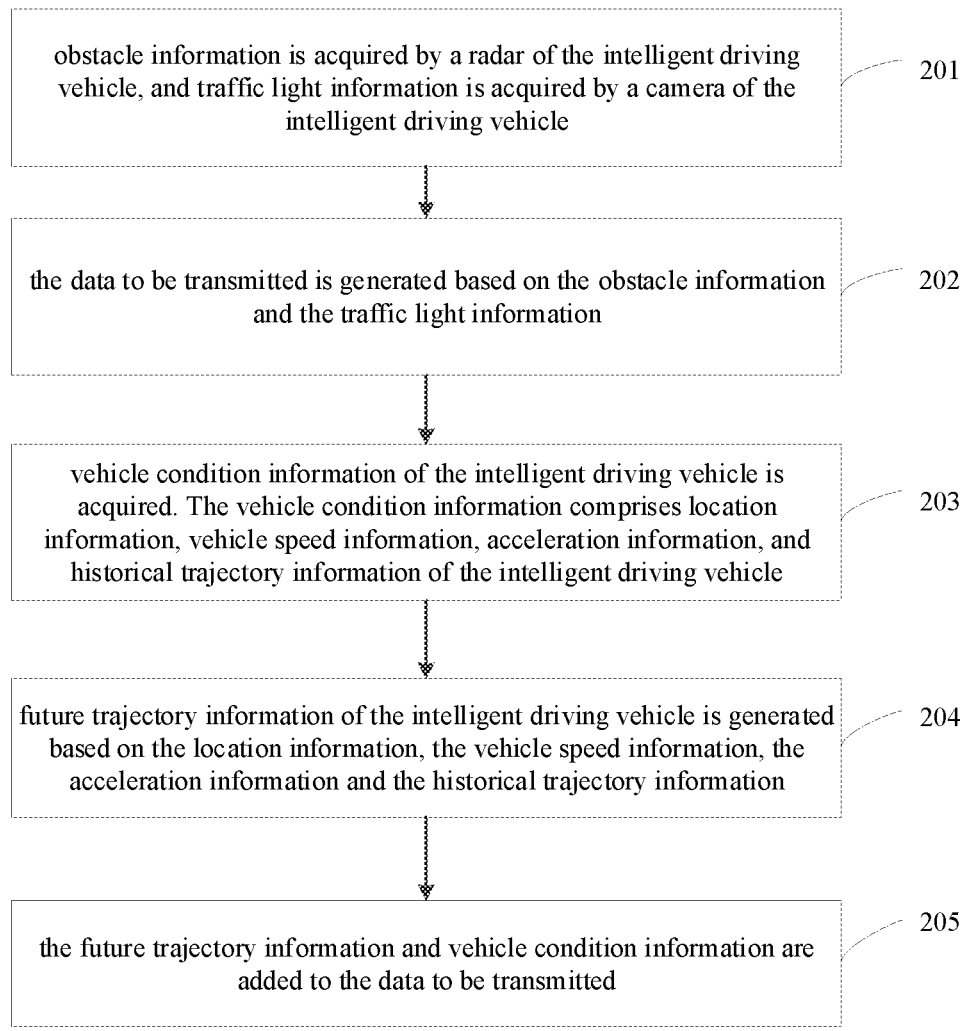
FIG. 3 is a flow chart of a data transmission method for an intelligent driving vehicle according to another embodiment of the present disclosure.

FIG. 3 is a flow chart of a data transmission method for an intelligent driving vehicle according to another embodiment of the present disclosure. As illustrated in FIG. 3, the method includes the following.

At block 201, obstacle information is acquired by a radar of the intelligent driving vehicle, and traffic light information is acquired by a camera of the intelligent driving vehicle.

At block 202, the data to be transmitted is generated based on the obstacle information and the traffic light information.

In an embodiment, the obstacle information may be acquired by the radar of the intelligent driving vehicle, and the data to be transmitted can be generated based on the obstacle information. The obstacle information includes location information of the obstacle, the size of the obstacle, and the like.

In an embodiment, the traffic light information may be acquired by the camera of the intelligent driving vehicle, and the data to be transmitted can be generated based on the traffic light information. The traffic light information includes location information of the traffic light, current condition information of the traffic light, and the like.

At block 203, vehicle condition information of the intelligent driving vehicle is acquired. The vehicle condition information includes location information, vehicle speed information, acceleration information, and historical trajectory information of the intelligent driving vehicle.

In an embodiment, the location information of the intelligent driving vehicle may be acquired by a positioning system of the intelligent driving vehicle, and the historical trajectory information can be generated according to the location information. The vehicle speed information and the acceleration information of the intelligent driving vehicle may be acquired by a speed sensor and an acceleration sensor.

In an embodiment, direction information of the intelligent driving vehicle may be acquired by a gyroscope, and the vehicle speed information and the acceleration information of the intelligent driving vehicle may be vectors.

At block 204, future trajectory information of the intelligent driving vehicle is generated based on the location information, the vehicle speed information, the acceleration information and the historical trajectory information.

In an embodiment of the present disclosure, the displacement of the intelligent driving vehicle at a future preset time interval may be acquired by a relevant algorithm according to the current vehicle speed information and the acceleration information, and then the future trajectory information of the intelligent driving vehicle can be generated according to the historical trajectory information, the location information and the displacement of the intelligent driving vehicle.

For example, vehicle speed information v and acceleration information a may be calculated according to a plane displacement integral equation, and displacement s of the intelligent driving vehicle at a future preset time interval t can be acquired. Moreover, location information B of the intelligent driving vehicle after the time interval t can be acquired according to current location information A and the displacement s of the intelligent driving vehicle, the trajectory in the further time interval t can be acquired according to the location information A and B, and the future trajectory information of the intelligent driving vehicle can be generated according to the trajectory and the historical trajectory information.

The preset time interval may be acquired according to a large amount of experimental data, or may be set according to actual needs, which is not limited herein.

At block 205, the future trajectory information and vehicle condition information are added to the data to be transmitted.

In one embodiment, the future trajectory information and the vehicle condition information are added to the data to be transmitted, and the data to be transmitted is sent by the intelligent driving vehicle to the server or other intelligent driving vehicles, and the server or other intelligent driving vehicles receives the data to be transmitted and analyzes the data, such that the server can schedule the intelligent driving vehicle according to the information, and other intelligent driving vehicles can learn the condition of the surrounding vehicles, thereby ensuring intelligent driving of the vehicle.

With the data transmission method for an intelligent driving vehicle according to the embodiments of the present disclosure, obstacle information, traffic light information, future trajectory information and vehicle condition information of the intelligent driving vehicle are acquired and are added to the data to be transmitted for transmission, and the data to be transmitted is received and analyzed by the server or other intelligent driving vehicles, such that the safety of the intelligent driving of the vehicle can be ensured.

Based on the above embodiment, the decoding of the data to be transmitted will be described below.

Figure 4:
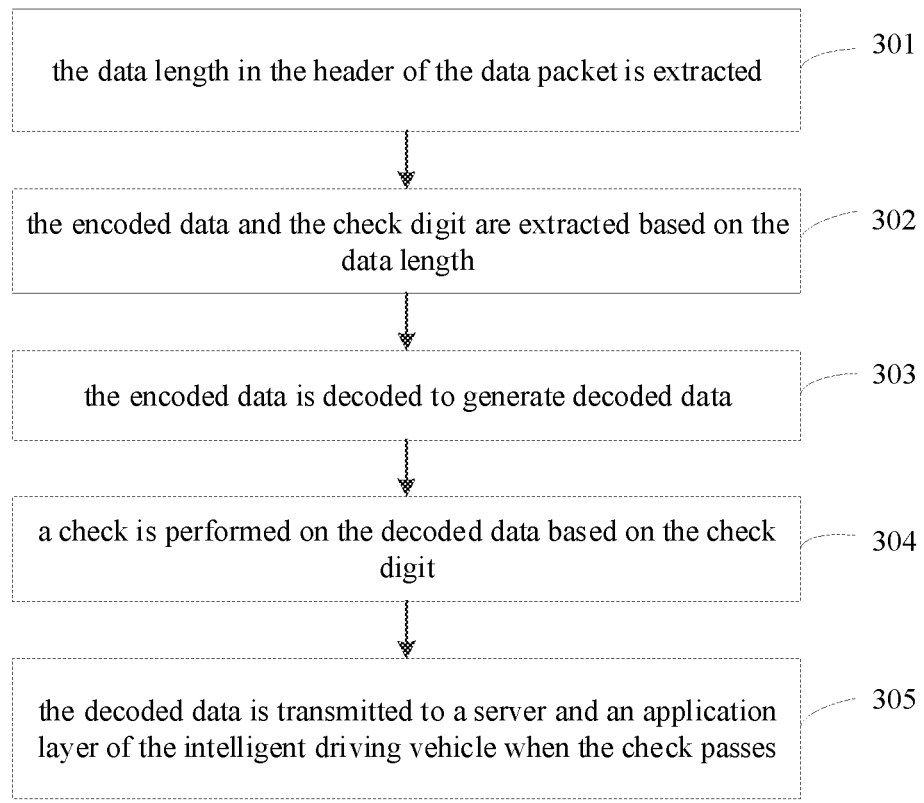
FIG. 4 is a flow chart of a data transmission method for an intelligent driving vehicle according to yet another embodiment of the present disclosure.

FIG. 4 is a flow chart of a data transmission method for an intelligent driving vehicle according to yet another embodiment of the present disclosure. As illustrated in FIG. 4, the method includes the following.

At block 301, the data length in the header of the data packet is extracted.

At block 302, the encoded data and the check digit are extracted based on the data length.

In the embodiment, the execution subject may be a server or other intelligent driving vehicles.

In an embodiment of the present disclosure, when the data to be transmitted is decoded, the data length in the header of the data packet may be extracted first, and the encoded data and the check digit can be determined according to the data length. For example, the data length is 8 bit, and data in the data packet is "100010001", it can be determined that the encoded data is "10001000" and the check digit is "1".

At block 303, the encoded data is decoded to generate decoded data.

At block 304, a check is performed on the decoded data based on the check digit.

For example, taking the serialization operation as an example, after the encoded data is extracted according to the data length, a deserialization operation may be performed on the encoded data to acquire the decoded data.

In an embodiment of the present disclosure, the decoded data may be checked based on the check digit to determine the accuracy of the decoded data.

In an embodiment of the present disclosure, when the check digit is generated according to the encoded data, the encoded data may be checked based on the check digit to determine the accuracy of the encoded data.

At block 305, the decoded data is transmitted to a server and an application layer of the intelligent driving vehicle when the check passes.

In an embodiment of the present disclosure, after the check passes, the decoded data may be transmitted to the server and the application layer of the intelligent driving vehicle, and analyzed by the server or other intelligent driving vehicles to obtain relevant information, such that the server can schedule the intelligent driving vehicle according to the information, and other intelligent driving vehicles can learn the status of the surrounding vehicles.

In an embodiment, the application layers of the server and other intelligent driving vehicles may perform scheduling control based on the future trajectory information of the intelligently driving vehicle. For example, the server receives future trajectory information a of an intelligent driving vehicle A and future trajectory information b of an intelligent driving vehicle B, and analyzes the information a and b through the application layer. When the server learns that the intelligent driving vehicles A and B may collide based on their current trajectory, the server may perform scheduling control on the intelligent driving vehicles A and B to change their direction or the speed, thereby ensuring the safety and reliability of intelligent driving.

The traffic light information, the vehicle condition information, the obstacle information, the future trajectory information can be acquired according to the decoded data.

In an embodiment of the present disclosure, when the check fails, the decoded data is discarded and a transmission failure message is fed back to the intelligent driving vehicle.

With the data transmission method for an intelligent driving vehicle according to embodiments of the present disclosure, by decoding and checking the encoded data, the probability of occurrence of packet error, packet loss or reordering can be reduced, and security and reliability of the data transmission can be increased. Moreover, the server and other intelligent driving vehicles perform scheduling control according to the relevant information to ensure safety and reliability of the autonomous driving system.

Figure 5:
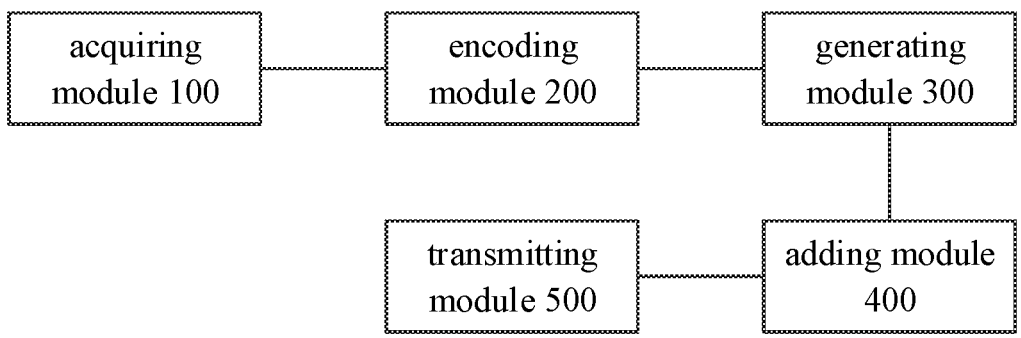
FIG. 5 is a schematic diagram of a data transmission device for an intelligent driving vehicle according to an embodiment of the present disclosure.

In order to implement the above embodiments, the present disclosure also provides a data transmission device for an intelligent driving vehicle. FIG. 5 is a schematic diagram of a data transmission device for an intelligent driving vehicle according to an embodiment of the present disclosure. As illustrated in FIG. 5, the device includes an acquiring module 100, an encoding module 200, a generating module 300, an adding module 400, and a transmitting module 500.

The acquiring module 100 is configured to acquire data to be transmitted.

The encoding module 200 is configured to encode the data to be transmitted to generate encoded data.

The generating module 300 is configured to generate a check digit according to the data to be transmitted.

The adding module 400 is configured to add the encoded data to a data packet. A trailer of the data packet includes the check digit.

The transmitting module 500 is configured to transmit the data packet.

Furthermore, the acquiring module 100 is configured to acquire obstacle information by a radar of the intelligent driving vehicle, and acquire traffic light information by a camera of the intelligent driving vehicle; and generate the data to be transmitted based on the obstacle information and the traffic light information.

Furthermore, the acquiring module 100 is further configured to acquire vehicle condition information of the intelligent driving vehicle, in which the vehicle condition information includes location information, vehicle speed information, acceleration information, and historical trajectory information of the intelligent driving vehicle; generate future trajectory information of the intelligent driving vehicle based on the location information, the vehicle speed information, the acceleration information and the historical trajectory information; and add the future trajectory information and the vehicle condition information to the data to be transmitted.

Furthermore, the encoding module 200 is configured to perform a serialization operation on the data to be transmitted.

Furthermore, the transmitting module 500 is configured to transmit the data packet to a server or other intelligent driving vehicles.

Furthermore, the adding module 400 is further configured to acquire a data length of the encoded data; and add the data length to a header of the data packet.

Figure 6:
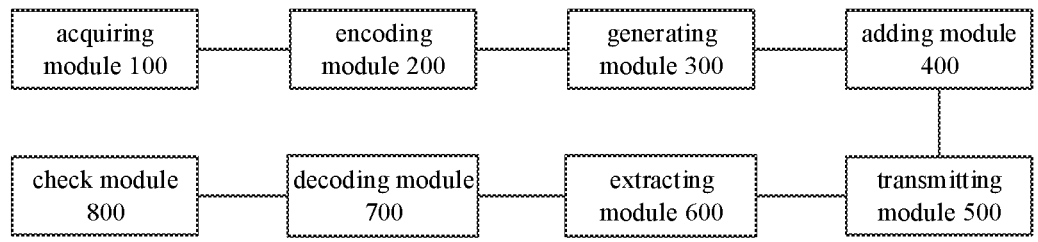
FIG. 6 is a schematic diagram of a data transmission device for an intelligent driving vehicle according to another embodiment of the present disclosure.

FIG. 6 is a schematic diagram of a data transmission device for an intelligent driving vehicle according to another embodiment of the present disclosure, on the basis of FIG. 5, the data transmission device further includes an extracting module 600, a decoding module 700, and a check module 800.

The extracting module 600 is configured to extract the data length in the header of the data packet, and extract the encoded data and the check digit based on the data length.

The decoding module 700 is configured to decode the encoded data to generate decoded data.

The check module 800 is configured to: perform a check on the decoded data based on the check digit; transmit the decoded data to an application layer of a server and the intelligent driving vehicle when the check passes; and discard the decoded data and feedback a transmission failure message when the check fails.

Furthermore, the application layer of the server and the intelligent driving vehicle performs scheduling control according to future trajectory information of the intelligent driving vehicle.

It should be noted that, the descriptions and explanations of the data transmission method for an intelligent driving vehicle in the above embodiments may also be applicable to the data transmission device for an intelligent driving vehicle according to the embodiment, and details are not described herein again.

With the data transmission device for an intelligent driving vehicle according to embodiments of the present disclosure, data to be transmitted is acquired and encoded to generate encoded data. Moreover, a check digit is generated according to the data to be transmitted, the encoded data and the check digit are added to the data packet, and the data packet is transmitted. Thus, by encoding the data to be transmitted, the data to be transmitted can be compressed, the transmitted data stream can be reduced, the probability of occurrence of packet error, packet loss or reordering can be reduced, and by converting meaningful text into meaningless garbled text, the security of data transmission can be increased.

In order to implement the above embodiments, the present disclosure further provides an electronic device including a processor and a memory. The memory is configured to store executable program codes, and the processor is configured to run a program corresponding to the executable program codes by reading the executable program codes stored in the memory to perform the data transmission method for an intelligent driving vehicle according to embodiments of the present disclosure.

In order to implement the above embodiments, the present disclosure provides a computer program product having stored thereon an instruction. When the instruction is executed by a processor, causes the data transmission method for an intelligent driving vehicle described in any of the above embodiments to be implemented.

Figure 7:
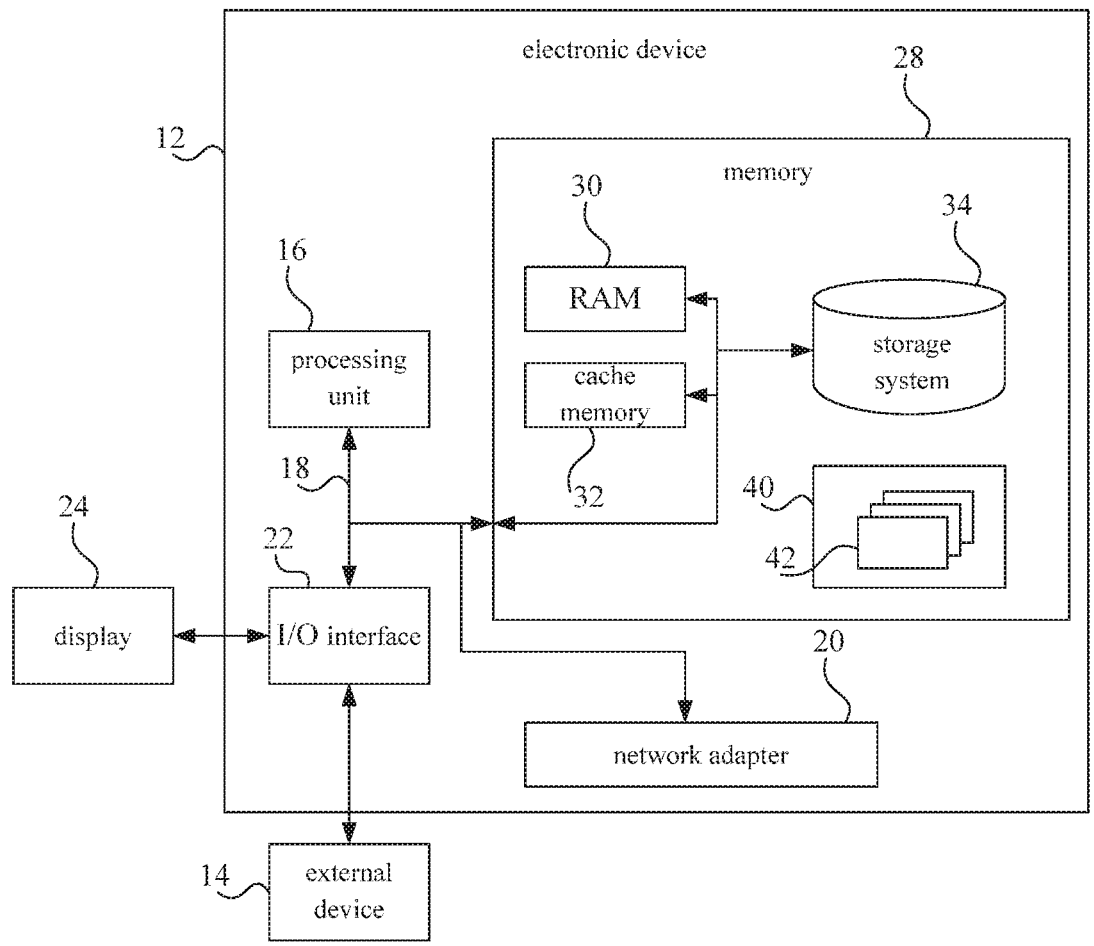
FIG. 7 is a block diagram of an exemplary electronic device suitable for implementing an embodiment of the present disclosure.

In order to implement the above embodiments, the present disclosure further provides a non-transitory computer readable storage medium having a computer program stored thereon, when the computer program is executed by a processor, causes the processor to implement the data transmission method for an intelligent driving vehicle described in any of the above embodiments FIG. 7 is a block diagram of an exemplary electronic device suitable for use in implementing embodiments of the present disclosure. The electronic device 12 shown in FIG. 7 is merely an example and should not impose ansy limitation on the function and scope of embodiments of the present disclosure.

As illustrated in FIG. 7, the electronic device 12 is in the form of a general-purpose computing apparatus. The electronic device 12 may include, but is not limited to, one or more processors or a processing unit 16, a system memory 28, and a bus 18 connecting different to system components (including the system memory 28 and the processing unit 16).

The bus 18 represents one or more of any of several types of bus structures, including a memory bus or a memory controller, a peripheral bus, an accelerated graphics port, a processor, or a local bus using any of a variety of bus structures. For example, these architectures include, but are not limited to, an Industry Standard Architecture (hereinafter referred to as ISA) bus, a Micro Channel Architecture (hereinafter referred to as MAC) bus, an enhanced ISA bus, a Video Electronics Standards Association (hereinafter referred to as VESA) local bus and Peripheral Component Interconnection (PCI) bus.

The electronic device 12 typically includes a variety of computer system readable media. These media may be any available media accessible by the electronic device 12, including volatile and non-volatile media, removable and non-removable media.

The system memory 28 may include a computer system readable medium in the form of volatile memory, such as a random-access memory (hereinafter referred to as RAM) 30 and/or a high-speed cache memory 32. The electronic device 12 may further include other removable or non-removable, volatile or non-volatile computer system storage medium. By way of example only, the storage system 34 may be configured to read and write non-removable and non-volatile magnetic media (not shown in FIG. 7, commonly referred to as a "hard drive"). Although not shown in FIG. 7, a magnetic disk driver for reading from and writing to a removable and non-volatile magnetic disk (such as "floppy disk") and a disk driver for reading from and writing to a removable and non-volatile optical disk (such as compact disk read only memory (hereinafter referred to as CD-ROM), a digital video disc read only memory (hereinafter referred to as DVD-ROM) or other optical media can be provided. In these cases, each driver may be connected to the bus 18 via one or more data medium interfaces. The memory 28 may include at least one program product. The program product has a set of (such as, at least one) program modules configured to perform the functions of various embodiments of the present disclosure.

A program/utility 40 having a set of (at least one) the program modules 42 may be stored in, for example, the memory 28. The program modules 42 include but are not limited to, an operating system, one or more application programs, other programs modules and program data. Each of these examples, or some combination thereof, may include an implementation of a network environment. The program modules 42 generally configured to perform functions and/or methods in embodiments of the present disclosure.

The electronic device 12 may also communicate with one or more external devices 14 (such as, a keyboard, a pointing device, a display 24, etc.). Furthermore, the electronic device 12 may also communicate with one or more devices enabling a user to interact with the electronic device 12 and/or other devices (such as a network card, a modem, etc.) enabling the electronic device 12 to communicate with one or more computer devices. This communication can be performed via the input/output (I/O) interface 22. Also, the electronic device 12 may communicate with one or more networks (such as a local area network (hereafter referred to as LAN), a wide area network (hereafter referred to as WAN) and/or a public network such as the Internet) through a network adapter 20. As shown in FIG. 7, the network adapter 20 communicates with other modules of the electronic device 12 over the bus 18. It should be understood that, although not shown in FIG. 7, other hardware and/or software modules may be used in conjunction with the electronic device 12, which include, but are not limited to, microcode, device drivers, redundant processing units, external disk drive arrays, RAID systems, tape drives, as well as data backup storage systems and the like.

The processing unit 16 is configured to execute various functional applications and data processing by running programs stored in the system memory 28, for example, to implement the method provided in embodiments of the present disclosure.

In addition, terms such as "first" and "second" are used herein for purposes of description and are not intended to indicate or imply relative importance or significance. Furthermore, the feature defined with "first" and "second" may include one or more this feature distinctly or implicitly. In the description of the present disclosure, "a plurality of" means two or more than two, such as two, or three unless specified otherwise.

In the description of the present disclosure, reference throughout this specification to "an embodiment," "some embodiments," "example," "a specific example," or "some examples," means that a particular feature, structure, material, or characteristic described in connection with the embodiment or example is included in at least one embodiment or example of the present disclosure. In the specification, the terms mentioned above are not necessarily referring to the same embodiment or example of the present disclosure. Furthermore, the particular features, structures, materials, or characteristics may be combined in any suitable manner in one or more embodiments or examples. Besides, any different embodiments and examples and any different characteristics of embodiments and examples may be combined by those skilled in the art without contradiction.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A data transmission method for an intelligent driving vehicle, comprising:
   acquiring data to be transmitted, the acquiring comprises:
      acquiring vehicle condition information of the intelligent driving vehicle, wherein the vehicle condition information comprises current location information, vehicle speed information, acceleration information, and historical trajectory information of the intelligent driving vehicle;
      determining a displacement of the intelligent driving vehicle within a future preset time interval by calculating the vehicle speed information and the acceleration information based on a plane displacement integral equation;
      determining future location information based on the displacement and the current location information;
      generating future trajectory information of the intelligent driving vehicle based on the future location information and the historical trajectory information; and
      adding the future trajectory information and the vehicle condition information to the data to be transmitted;
   encoding the data to be transmitted to generate encoded data; acquiring a data length of the encoded data;
   generating a check digit according to the data to be transmitted;
   adding the encoded data to a data packet and the data length to a header of the data packet, wherein a trailer of the data packet comprises the check digit; and
   transmitting the data packet to a server or other intelligent driving vehicles;
   wherein the method further comprises:
   extracting the data length in the header of the data packet;
   extracting the encoded data and the check digit based on the data length;
   decoding the encoded data to generate decoded data;
   performing a check on the decoded data based on the check digit;
   transmitting the decoded data to an application layer of the server or other intelligent driving vehicles when the check passes; and
   discarding the decoded data, and feedbacking a transmission failure message when the check fails.

2. The data transmission method according to claim 1, wherein acquiring the data to be transmitted comprises:
   acquiring obstacle information by a radar of the intelligent driving vehicle, and acquiring traffic light information by a camera of the intelligent driving vehicle; and
   generating the data to be transmitted based on the obstacle information and the traffic light information.

3. The data transmission method according to claim 1, wherein encoding the data to be transmitted comprises:
   serializing by a protocol buffer, the data to be transmitted to binary data and obtaining a data length of the binary data.

4. The data transmission method according to claim 1, further comprising:
   performing scheduling control by the application layer of the server or the intelligent driving vehicle according to future trajectory information of the intelligent driving vehicle.

5. A data transmission device for an intelligent driving vehicle, comprising:
   a processor; and
   a memory, configured to store executable program codes;
   wherein the processor is configured to run a program corresponding to the executable program codes by reading the executable program codes stored in the memory, to:
   acquire data to be transmitted;
   encode the data to be transmitted to generate encoded data;
   acquire a data length of the encoded data;

generate a check digit according to the data to be transmitted;
add the encoded data to a data packet and the data length to a header of the data packet, wherein a trailer of the data packet comprises the check digit; and
transmit the data packet to a server or other intelligent driving vehicles;
wherein the processor is further configured to:
extract the data length in the header of the data packet;
extract the encoded data and the check digit based on the data length;
decode the encoded data to generate decoded data;
perform a check on the decoded data based on the check digit;
transmit the decoded data to an application layer of the server or other intelligent driving vehicles when the check passes; and
discard the decoded data, and feedbacking a transmission failure message when the check fails,
wherein the acquiring data to be transmitted comprises:
acquiring vehicle condition information of the intelligent driving vehicle, wherein the vehicle condition information comprises current location information, vehicle speed information, acceleration information, and historical trajectory information of the intelligent driving vehicle;
determining a displacement of the intelligent driving vehicle within a future preset time interval by calculating the vehicle speed information and the acceleration information based on a plane displacement integral equation;
determining future location information based on the displacement and the current location information;
generating future trajectory information of the intelligent driving vehicle based on the future location information and the historical trajectory information; and
adding the future trajectory information and the vehicle condition information to the data to be transmitted.

6. The data transmission device according to claim 5, wherein in acquiring the data to be transmitted, the processor is configured to:
acquire obstacle information by a radar of the intelligent driving vehicle, and acquire traffic light information by a camera of the intelligent driving vehicle; and
generate the data to be transmitted based on the obstacle information and the traffic light information.

7. The data transmission device according to claim 5, wherein in encoding the data to be transmitted, the processor is configured to:
serialize by a protocol buffer, the data to be transmitted to binary data and obtain a data length of the binary data.

8. The data transmission device according to claim 5, wherein the processor is configured to:
perform scheduling control by the application layer of the server or the intelligent driving vehicle according to future trajectory information of the intelligent driving vehicle.

9. A non-transitory computer readable storage medium having stored thereon a computer program that, when executed by a processor, causes a data transmission method for an intelligent driving vehicle to be implemented, the method comprising:
acquiring data to be transmitted, the acquiring comprises:
acquiring vehicle condition information of the intelligent driving vehicle, wherein the vehicle condition information comprises current location information, vehicle speed information, acceleration information, and historical trajectory information of the intelligent driving vehicle;
determining a displacement of the intelligent driving vehicle within a future preset time interval by calculating the vehicle speed information and the acceleration information based on a plane displacement integral equation;
determining future location information based on the displacement and the current location information;
generating future trajectory information of the intelligent driving vehicle based on the future location information and the historical trajectory information; and
adding the future trajectory information and the vehicle condition information to the data to be transmitted;
encoding the data to be transmitted to generate encoded data;
acquiring a data length of the encoded data;
generating a check digit according to the data to be transmitted;
adding the encoded data to a data packet and the data length to a header of the data packet, wherein a trailer of the data packet comprises the check digit; and
transmitting the data packet to a server or other intelligent driving vehicles;
wherein the method further comprises:
extracting the data length in the header of the data packet;
extracting the encoded data and the check digit based on the data length;
decoding the encoded data to generate decoded data;
performing a check on the decoded data based on the check digit;
transmitting the decoded data to an application layer of the server or other intelligent driving vehicles when the check passes; and
discarding the decoded data, and feedbacking a transmission failure message when the check fails.

10. The non-transitory computer readable storage medium according to claim 9, wherein acquiring the data to be transmitted comprises:
acquiring obstacle information by a radar of the intelligent driving vehicle, and acquiring traffic light information by a camera of the intelligent driving vehicle; and
generating the data to be transmitted based on the obstacle information and the traffic light information.

11. The non-transitory computer readable storage medium according to claim 9, wherein encoding the data to be transmitted comprises:
serializing by a protocol buffer, the data to be transmitted to binary data and obtaining a data length of the binary data.

* * * * *